(12) United States Patent
Chen

(10) Patent No.: US 11,881,278 B2
(45) Date of Patent: Jan. 23, 2024

(54) REDUNDANT CIRCUIT ASSIGNING METHOD AND DEVICE, APPARATUS AND MEDIUM

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 178 days.

(21) Appl. No.: 17/568,948

(22) Filed: Jan. 5, 2022

(65) Prior Publication Data
US 2022/0317908 A1 Oct. 6, 2022

Related U.S. Application Data

(63) Continuation of application No. PCT/CN2021/109442, filed on Jul. 30, 2021.

(30) Foreign Application Priority Data

Mar. 31, 2021 (CN) .......................... 202110352509.2

(51) Int. Cl.
G06F 3/06 (2006.01)
G11C 29/44 (2006.01)

(52) U.S. Cl.
CPC ........ *G11C 29/4401* (2013.01); *G06F 3/0604* (2013.01); *G06F 3/0644* (2013.01); *G06F 3/0679* (2013.01); *G11C 29/44* (2013.01)

(58) Field of Classification Search
None
See application file for complete search history.

(56) References Cited

U.S. PATENT DOCUMENTS 6,067,259 A  5/2000 Handa
6,535,993 B1 3/2003 Hamada
(Continued)

FOREIGN PATENT DOCUMENTS

CN  1195814 A  10/1998
CN  1366308 A  8/2002
(Continued)

OTHER PUBLICATIONS

International Search Report in the international application No. PCT/CN2021/099159, dated Sep. 8, 2021, 2 pgs.
(Continued)

*Primary Examiner* — Cynthia Britt
*Assistant Examiner* — Matthew W Wahlin
(74) *Attorney, Agent, or Firm* — Cooper Legal Group, LLC

(57) ABSTRACT

A redundant circuit assigning method a includes: first test item is executed and first test data is acquired; a first redundant circuit assigning result including the number of assigned local redundant circuits and position data of the assigned local redundant circuits is determined according to the first test data; a second test item is executed and second test data is acquired; when fail bits acquired during execution of the second test item include one or more fail bits beyond the repair range of the assigned local redundant circuits and assigned global redundant circuits, and the assignable redundant circuits have been assigned out, target position data of fail bits in a target subdomain and a related subdomain is acquired based on the first test data and the second test data; and a second redundant circuit assigning result is determined according to the first test data and the second test data.

20 Claims, 13 Drawing Sheets

(56) References Cited

U.S. PATENT DOCUMENTS

| | | | |
|---|---|---|---|
| 6,741,509 | B2 | 5/2004 | Kato |
| 6,876,588 | B2 | 4/2005 | Kato |
| 7,079,432 | B2 | 7/2006 | Kato |
| 7,127,647 | B1 | 10/2006 | Zorian |
| 7,224,596 | B2 | 5/2007 | Jeong |
| 10,446,253 | B2 | 10/2019 | Choi |
| 2001/0009521 | A1 | 7/2001 | Hidaka |
| 2001/0026486 | A1 | 10/2001 | Ogawa |
| 2002/0001896 | A1 | 1/2002 | Yoon |
| 2002/0114198 | A1 | 8/2002 | Kato |
| 2002/0191454 | A1 | 12/2002 | Beer |
| 2003/0164510 | A1 | 9/2003 | Dono |
| 2003/0191991 | A1 | 10/2003 | Hsu |
| 2004/0062134 | A1 | 4/2004 | Kato |
| 2004/0210803 | A1 | 10/2004 | Cheng |
| 2004/0218433 | A1 | 11/2004 | Kang |
| 2005/0039073 | A1 | 2/2005 | Hartmann |
| 2005/0122802 | A1 | 6/2005 | Kato |
| 2006/0090058 | A1 | 4/2006 | Chng |
| 2006/0098503 | A1 | 5/2006 | Jeong |
| 2007/0247937 | A1 | 10/2007 | Moriyama |
| 2007/0297230 | A1 | 12/2007 | Chen |
| 2009/0119537 | A1 | 5/2009 | Lee |
| 2009/0316469 | A1 | 12/2009 | Rodriguez |
| 2009/0319839 | A1 | 12/2009 | Surulivel |
| 2010/0157656 | A1 | 6/2010 | Tsuchida |
| 2010/0169705 | A1 | 7/2010 | Fujii |
| 2010/0290299 | A1 | 11/2010 | Matsumoto |
| 2010/0322024 | A1 | 12/2010 | Yagishita |
| 2011/0002169 | A1 | 1/2011 | Li |
| 2011/0090751 | A1 | 4/2011 | Manna |
| 2011/0199845 | A1 | 8/2011 | Yang |
| 2012/0066484 | A1 | 3/2012 | Yin |
| 2012/0173932 | A1 | 7/2012 | Li |
| 2012/0206973 | A1 | 8/2012 | He |
| 2012/0257467 | A1 | 10/2012 | Kosugi |
| 2012/0275249 | A1 | 11/2012 | Yang |
| 2012/0297245 | A1 | 11/2012 | Li |
| 2013/0173970 | A1 | 7/2013 | Kleveland |
| 2014/0146613 | A1 | 5/2014 | Yang et al. |
| 2014/0219023 | A1 | 8/2014 | Li et al. |
| 2015/0066417 | A1* | 3/2015 | Kimura ............... G06F 11/2294 702/123 |
| 2015/0178614 | A1 | 6/2015 | Lin |
| 2015/0248322 | A1 | 9/2015 | Hara et al. |
| 2016/0005452 | A1 | 1/2016 | Bae |
| 2016/0307645 | A1 | 10/2016 | Kim |
| 2016/0351276 | A1 | 12/2016 | Shim |
| 2017/0110206 | A1 | 4/2017 | Ryu et al. |
| 2017/0133108 | A1 | 5/2017 | Lee |
| 2018/0182467 | A1 | 6/2018 | Kang et al. |
| 2019/0164621 | A1 | 5/2019 | Kim |
| 2019/0237154 | A1 | 8/2019 | Choi |
| 2019/0287641 | A1 | 9/2019 | Ko |
| 2019/0348100 | A1 | 11/2019 | Smith et al. |
| 2019/0348102 | A1 | 11/2019 | Smith et al. |
| 2020/0152285 | A1 | 5/2020 | Nakaoka |
| 2020/0243159 | A1 | 7/2020 | Kang et al. |
| 2022/0058079 | A1 | 2/2022 | Chen |
| 2022/0058080 | A1 | 2/2022 | Chen |
| 2022/0059182 | A1 | 2/2022 | Chen |
| 2022/0270668 | A1 | 8/2022 | Li et al. |
| 2022/0310187 | A1 | 9/2022 | Chen |
| 2022/0317908 | A1 | 10/2022 | Chen |

FOREIGN PATENT DOCUMENTS

| | | | |
|---|---|---|---|
| CN | 1404140 | A | 3/2003 |
| CN | 1409323 | A | 4/2003 |
| CN | 1467746 | A | 1/2004 |
| CN | 101329918 | A | 12/2008 |
| CN | 101331554 | A | 12/2008 |
| CN | 101630337 | A | 1/2010 |
| CN | 101765889 | A | 6/2010 |
| CN | 102157203 | A | 8/2011 |
| CN | 101765889 | B | 12/2013 |
| CN | 103473160 | A | 12/2013 |
| CN | 103688247 | A | 3/2014 |
| CN | 103871447 | A | 6/2014 |
| CN | 105787817 | A | 7/2016 |
| CN | 105989899 | A | 10/2016 |
| CN | 109753374 | A | 5/2019 |
| CN | 110010187 | A | 7/2019 |
| CN | 110364214 | A | 10/2019 |
| CN | 110556157 | A | 12/2019 |
| CN | 110797071 | A | 2/2020 |
| CN | 110797072 | A | 2/2020 |
| CN | 110879931 | A | 3/2020 |
| CN | 110968985 | A | 4/2020 |
| CN | 111312321 | A | 6/2020 |
| CN | 112216621 | A | 1/2021 |
| CN | 112885398 | A | 6/2021 |
| CN | 112908402 | A | 6/2021 |
| CN | 112908403 | A | 6/2021 |
| EP | 1217524 | A2 | 6/2002 |
| JP | 2000048596 | A | 2/2000 |
| JP | 2008084409 | A | 4/2008 |
| KR | 10-0795520 | B1 * | 1/2008 ............. G11C 29/00 |
| KR | 100795520 | B1 | 1/2008 |
| KR | 20160016422 | A | 2/2016 |
| KR | 20190093358 | A | 8/2019 |
| TW | 376558 | B | 12/1999 |
| TW | 470964 | B | 1/2002 |
| TW | 200923960 | A | 6/2009 |
| TW | 201110132 | A | 3/2011 |
| TW | 201642273 | A | 12/2016 |

OTHER PUBLICATIONS

International Search Report in the international application No. PCT/CN2021/099149, dated Sep. 7, 2021, 2 pgs.
International Search Report in the international application No. PCT/CN2021/099146, dated Sep. 7, 2021, 2 pgs.
International Search Report in the international application No. PCT/CN2021/099173, dated Aug. 26, 2021, 2 pgs.
Supplementary European Search Report in the European application No. 21773439.1, dated Jun. 27, 2022, 8 pgs.
English translation of the Written Opinion of the International Search Authority in the international application No. PCT/CN2021/099159, dated Sep. 8, 2021, 4 pgs.
English translation of the Written Opinion of the International Search Authority in the international application No. PCT/CN2021/099149, dated Sep. 7, 2021, 4 pgs.
First Office Action of the U.S. Appl. No. 17/464,886, dated Feb. 21, 2023, 32 pgs.
First Office Action of the U.S. Appl. No. 17/462,042, dated Mar. 2, 2023, 63 pgs.
English translation of the Written Opinion of the International Search Authority in the international application No. PCT/CN2021/099146, dated Sep. 7, 2021, 4 pgs.
English translation of the Written Opinion of the International Search Authority in the international application No. PCT/CN2021/099173, dated Aug. 26, 2021, 3 pgs.
First Office Action of the U.S. Appl. No. 17/445,300, dated Mar. 2, 2023, 59 pgs.
International Search Report in the international application No. PCT/CN2021/109442, dated Jan. 4, 2022, 3 pgs.
Notice of Allowance of the Chinese application No. 202110352509.2, dated Apr. 15, 2022, 7 pgs.
International Search Report in the international application No. PCT/CN2021/109515, dated Dec. 30, 2021, 2 pgs.
Notice of Allowance of the Chinese application No. 202110352499.2, dated Apr. 15, 2022, 8 pgs.
First Office Action of the U.S. Appl. No. 17/515,776, dated Mar. 3, 2023, 21 pgs.
International Search Report in the international application No. PCT/CN2021/109464, dated Dec. 30, 2021, 2 pgs.
Notice of Allowance of the Chinese application No. 202110327478.5, dated Apr. 25, 2022, 7 pgs.

(56) References Cited

OTHER PUBLICATIONS

"Enhancement of Fault Collection for Embedded RAM Redundancy Analysis Considering Intersection and Orphan Faults", Stefan Kristofik and Peter Malik, Mar. 2018, Integration, The VLSI Journal, North-Holland Publishing Company, Amsterdam, vol. 62, pp. 190-204.
"On the Repair of Redundant RAM's", Chin-Long Wey and Fabrizio Lombardi, Mar. 1987, IEEE Transactions on Computer-Aided Design of Integrated Circuits and Systems, IEEE, vol. CAD-06, No. 2, pp. 222-231.
First Office Action of the European application No. 21773439.1, dated Feb. 24, 2023, 6 pgs.
Notice of Allowance of the U.S. Appl. No. 17/462,042, dated Jun. 20, 2023. 63 pages.
Notice of Allowance of the U.S. Appl. No. 17/445,300, dated Aug. 17, 2023. 65 pages.
First Office Action of the U.S. Appl. No. 17/446,978, dated Aug. 21, 2023. 51 pages.
First Office Action of the U.S. Appl. No. 17/648,665, dated Aug. 28, 2023. 67 pages.

\* cited by examiner

REDUNDANT CIRCUIT ASSIGNING METHOD AND DEVICE, APPARATUS AND MEDIUM

CROSS-REFERENCE TO RELATED APPLICATIONS

This application is a continuation of International Application No. PCT/CN2021/109442, filed on Jul. 30, 2021, which claims priority to Chinese Patent Application No. 202110352509.2, filed on Mar. 31, 2021. The disclosures of International Application No. PCT/CN2021/109442 and Chinese Patent Application No. 202110352509.2 are hereby incorporated by reference in their entireties.

TECHNICAL FIELD

The disclosure relates to the field of semiconductors, and in particular to a redundant circuit assigning method and device, an apparatus and a medium.

BACKGROUND

With the rapid development of semiconductor memory technology, market has placed higher demands on memory performance and reliability of semiconductor memory devices. The number and density of memory cells in the semiconductor memory devices are continuously increased, so that the total number of fail bits in the semiconductor memory devices and the percentage relative to the total number of the memory cells are continuously increased, and the memory performance and reliability of the semiconductor memory devices are influenced.

A preset number of redundant circuits are additionally arranged in a storage array area of the semiconductor storage device in advance, address lines with fail bits are exchanged through the redundant circuits, the semiconductor storage device with the fail bits is repaired, and then the memory performance and reliability of the semiconductor memory device can be effectively improved.

How to determine a redundant circuit assigning repair scheme under the condition that the number of available redundant circuits in the semiconductor memory device is known, so that the utilization efficiency of the redundant circuits is improved on the premise of ensuring that all fail bits can be repaired becomes one of the technical problems urgently required to be solved in the process of further improving the memory performance and reliability of the semiconductor memory device.

SUMMARY

A first aspect of the disclosure provides a redundant circuit assigning method, which includes the following operations. A first test item is executed and first test data is acquired, where the first test data includes position data of fail bits acquired during execution of the first test item. A first redundant circuit assigning result is determined according to the first test data, and the first redundant circuit assigning result includes a number of assigned local redundant circuits and position data of the assigned local redundant circuits. A second test item is executed and second test data is acquired, where the second test data includes position data of fail bits acquired during execution of the second test item. When the fail bits acquired during execution of the second test item include one or more fail bits beyond a repair range of the assigned local redundant circuits and assigned global redundant circuits, and the number of the assigned local redundant circuits is equal to a number of assignable local redundant circuits, target position data of fail bits in a target subdomain and a related subdomain is acquired based on the first test data and the second test data, a second redundant circuit assigning result is determined according to the target position data, and the target subdomain is a subdomain where the fail bits beyond the repair range are located.

A second aspect of the disclosure provides a redundant circuit assigning device, including a memory storing processor-executable instructions and a processor. The processor is configured to execute the stored processor-executable instructions to perform operations of: executing a first test item and acquiring first test data, wherein the first test data comprises position data of fail bits acquired during execution of the first test item; determining a first redundant circuit assigning result according to the first test data, wherein the first redundant circuit assigning result comprises a number of assigned local redundant circuits and position data of the assigned local redundant circuits; executing a second test item and acquiring second test data, wherein the second test data comprises position data of fail bits acquired during execution of the second test item; and when the fail bits acquired during execution of the second test item comprise one or more fail bits beyond a repair range of the assigned local redundant circuits and assigned global redundant circuits, and the number of the assigned local redundant circuits is equal to a number of assignable local redundant circuits, acquiring target position data of fail bits in a target subdomain and a related subdomain based on the first test data and the second test data, and determining a second redundant circuit assigning result according to the target position data, wherein the target subdomain is a subdomain where the fail bits beyond the repair range are located.

A third aspect of the disclosure provides a non-transitory computer-readable storage medium having stored thereon computer-executable instructions that, when executed by a processor, cause the processor to perform operations of: executing a first test item and acquiring first test data, wherein the first test data comprises position data of fail bits acquired during execution of the first test item; determining a first redundant circuit assigning result according to the first test data, wherein the first redundant circuit assigning result comprises a number of assigned local redundant circuits and position data of the assigned local redundant circuits; executing a second test item and acquiring second test data, wherein the second test data comprises position data of fail bits acquired during execution of the second test item; and when the fail bits acquired during execution of the second test item comprise one or more fail bits beyond a repair range of the assigned local redundant circuits and assigned global redundant circuits, and the number of the assigned local redundant circuits is equal to a number of assignable local redundant circuits, acquiring target position data of fail bits in a target subdomain and a related subdomain based on the first test data and the second test data, and determining a second redundant circuit assigning result according to the target position data, wherein the target subdomain is a subdomain where the fail bits beyond the repair range are located.

BRIEF DESCRIPTION OF THE DRAWINGS

In order to describe the technical solutions in the embodiments of the disclosure more clearly, the drawings required to be used in descriptions about the embodiments will be simply introduced below, obviously, the drawings described below are only some embodiments of the disclosure, and other drawings can further be obtained by those skill in the art according to the drawings without creative work.

DETAILED DESCRIPTION

Figure 1:
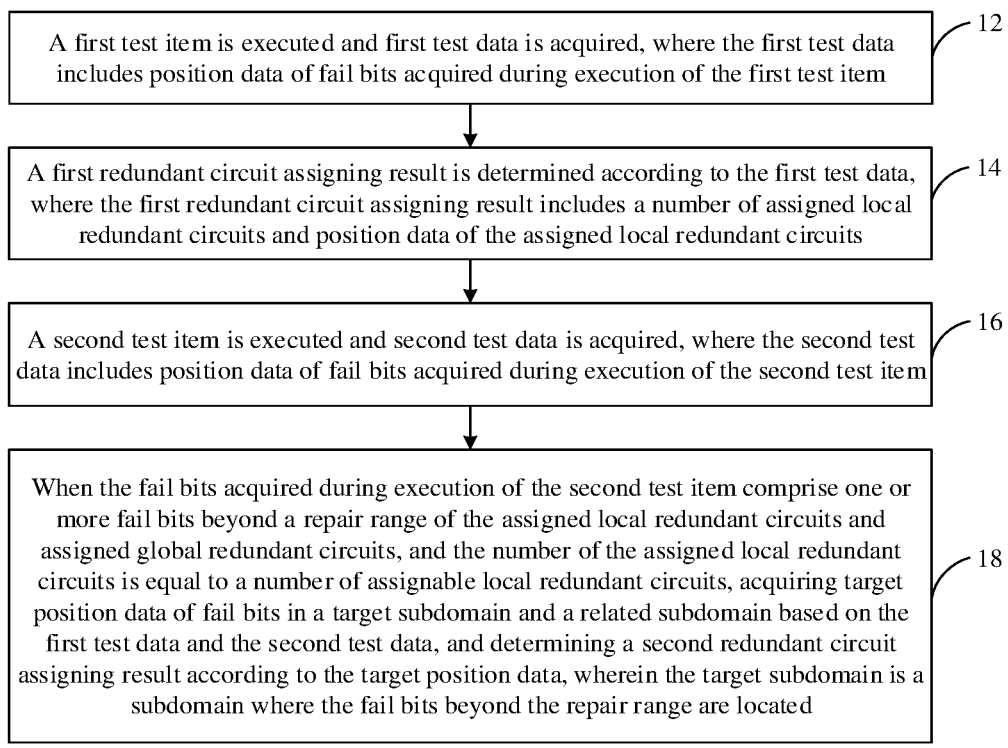
FIG. 1 is a schematic flow diagram of a redundant circuit assigning method according to a first embodiment of the disclosure.

In order to facilitate an understanding of the disclosure, a more complete description of the disclosure will now be made with reference to the related drawings. Preferable embodiments of the disclosure are given in the drawings. However, the disclosure can be realized in many different forms and is not limited to the embodiments described herein. Rather, the embodiments are provided so that a more thorough and complete understanding of the content of the disclosure is provided.

Unless defined otherwise, all technical and scientific terms used herein have the same meaning as commonly understood by those skilled in the art to which this disclosure belongs. The terms used in the specification of the disclosure herein are for the purpose of describing the specific embodiments only and are not intended to be limiting of the disclosure. Where "comprising," "having," and "including" as described herein are used, another component can also be added unless explicit qualifiers such as "only," "consisting of," and the like are used. Unless mentioned to the contrary, a term in the singular can include the plural and is not to be construed as one in number.

It is to be understood that, although the terms "first," "second," and the like can be used herein to describe various elements, these elements should not be limited by these terms. These terms are only used to distinguish one element from another. For example, a first element could be termed a second element, and, similarly, a second element could be termed a first element, without departing from the scope of the disclosure.

The invention motivation and implementation principle of the disclosure are illustrated by assigning redundant circuits to a Dynamic Random Access Memory (DRAM) chip to repair fail bits in the DRAM chip as an example. The operation of assigning redundant circuits to the DRAM chip to repair the fail bits generally includes two types as follows.

(1) Single Assignment Repair Scheme

Before fusing assigned redundant circuits to repair the fail bits in the repair range of the redundant circuits, position data of the fail bits is acquired by running a preset test item once, and the redundant circuits are assigned according to the acquired position data of the fail bits. The position data of all fail bits can be obtained only after all test items are executed; after the position data of the fail bits is acquired, the redundant circuits are assigned to the fail bits with known position data and a repair action is executed, and it is determined whether the chip with quality defect cannot be found in time due to the fact that the number of the fail bits of the tested chip is too large, the assignable redundant circuits have been used up and the fail bits are not repaired; and meanwhile, before the chip with quality defect is detected, all test items have been executed, so that a lot of test time is wasted, and the chip with quality defect cannot be avoided.

(2) Multi Discontinuous Assignment Repair Scheme

After the position data of the fail bits is acquired by running the preset test item each time, the redundant circuits are assigned according to the acquired position data of the fail bits without executing the repair action; furthermore, the preset test item inherits the redundant circuit assigning result corresponding to the previous test result in each time of running; and after the preset test items are operated for multiple times and the position data of all the fail bits is acquired, the repair action is executed according to the redundant circuit assigning result corresponding to the last test result. Therefore, on the premise that it is determined that all the fail bits in the tested chip can be repaired by the assignable redundant circuits, the repair action is executed according to the redundant circuit assigning result corresponding to the last test result, so that the efficiency of test repair of the chip is effectively improved, and the chip with quality defect and waste of repair resources for the chip with quality defect are avoided. However, in the multi discontinuous assignment repair scheme, the redundant circuit assigning results corresponding to the multiple test results are made without acquisition of the position data of all fail bits, then a situation that the fail bits are not covered by the repair range of the actually assigned redundant circuits is likely to occur under the condition that all the fail bits can be really and completely repaired, so that the yield of the semiconductor memory chip is reduced; and in addition, a situation that the same fail bit is repeatedly repaired by different types of redundant circuits easily occurs, and thus the repair cost is increased.

Therefore, the disclosure aims at providing a redundant circuit assigning method, on the premise of ensuring that all fail bits can be repaired, the utilization efficiency of redundant circuits is improved, the situation of repeated repair is avoided, therefore, the repair cost is reduced, and meanwhile, the yield of a semiconductor memory chip is improved.

Referring to FIG. 1, in an embodiment of the disclosure, a redundant circuit assigning method is provided, which includes the following operations.

In S12, a first test item is executed and first test data is acquired, where the first test data includes position data of fail bits acquired during execution of the first test item.

In S14, a first redundant circuit assigning result is determined according to the first test data, and the first redundant circuit assigning result includes the number of assigned local redundant circuits and position data of the assigned local redundant circuits.

In S16, a second test item is executed and second test data is acquired, where the second test data includes position data of fail bits acquired during execution of the second test item.

In S18, when the fail bits acquired during execution of the second test item include one or more fail bits beyond the repair range of assigned local redundant circuits and assigned global redundant circuits, and the number of the assigned local redundant circuits is equal to the number of assignable local redundant circuits, target position data of fail bits in a target subdomain and a related subdomain are acquired based on the first test data and the second test data, a second redundant circuit assigning result is determined according to the target position data, and the target subdomain is a subdomain where the fail bits beyond the repair range are located.

Figure 2:
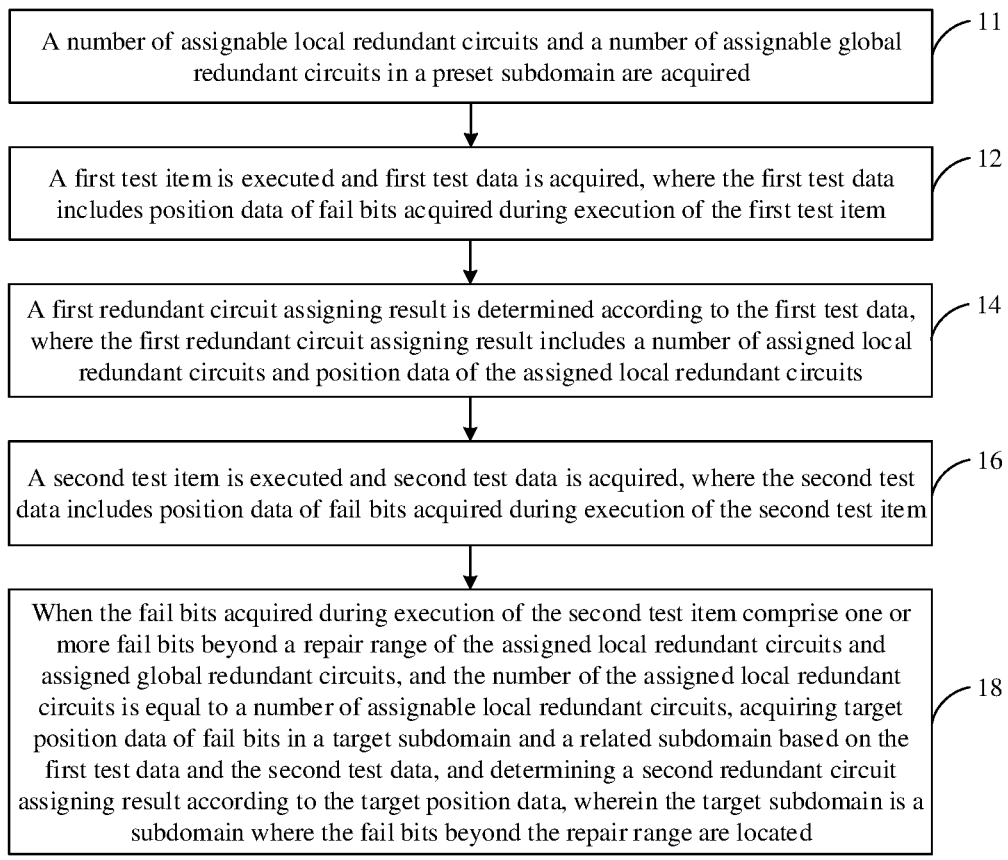
FIG. 2 is a schematic flow diagram of a redundant circuit assigning method according to a second embodiment of the disclosure.

As an example, with further reference to FIG. 1, under the condition that the number of assignable local redundant circuits and the number of assignable global redundant circuits are both known, the first test item is executed, the first test data are acquired, the first test data includes position data of fail bits acquired during execution of the first test item, the first redundant circuit assigning result is determined according to the first test data, and the first redundant circuit assigning result includes the number of assigned local redundant circuits and position data of the assigned local redundant circuits; the second test item is executed, the second test data is acquired, where the second test data includes position data of fail bits acquired during execution of the second test item; and when the fail bits acquired during execution of the second test item include one or more fail bits beyond the repair range of assigned local redundant circuits and assigned global redundant circuits, and the number of the assigned local redundant circuits is equal to the number of assignable local redundant circuits, the second redundant circuit assigning result is determined according to the condition of the subdomain where the fail bits to be repaired are located, on the premise of ensuring that all the fail bits can be repaired by the assigned local redundant circuits and the assigned global redundant circuits, the sum of the number of the assigned local redundant circuits and the number of the assigned global redundant circuits is reduced as much as possible, the situation of repeated repair is avoided, and thus the utilization efficiency of the redundant circuits is improved. When the yield is low, the number of the fail bits is large, so that the distribution of the fail bits in one area is relatively complex, the method only performs re-assigning on part of the redundant circuits in the subdomain meeting the condition, so that the processing range of calculation of redundant circuit assigning can be greatly reduced, and the calculation speed is increased. Furthermore, referring to FIG. 2, in an embodiment of the disclosure, the operation prior to the step that the first test item is executed and the first test data is acquired, further includes the following operations.

In S11, the number of assignable local redundant circuits and the number of assignable global redundant circuits in the preset subdomain are acquired.

By acquiring the number of assignable local redundant circuits and the number of assignable global redundant circuits in the preset subdomain, a preferable redundant circuit assigning scheme is determined according to the number of assignable local redundant circuits and the number of assignable global redundant circuits. On the premise of ensuring that all fail bits can be repaired by the assigned local redundant circuits and the assigned global redundant circuits, the sum of the number of the assigned local redundant circuits and the number of the assigned global redundant circuits is reduced as much as possible, then the situation of repeated repair is avoided, and the utilization efficiency of the redundant circuits is improved.

As an example, in an embodiment of the disclosure, an extension direction of the local redundant circuits is consistent with an extension direction of bit lines; an extension direction of the global redundant circuits is consistent with an extension direction of word lines, so that the local redundant circuits can repair the fail bits in the row direction in a memory cell array, and the global redundant circuits can repair the fail bits in the column direction in the memory cell array.

Figure 3:
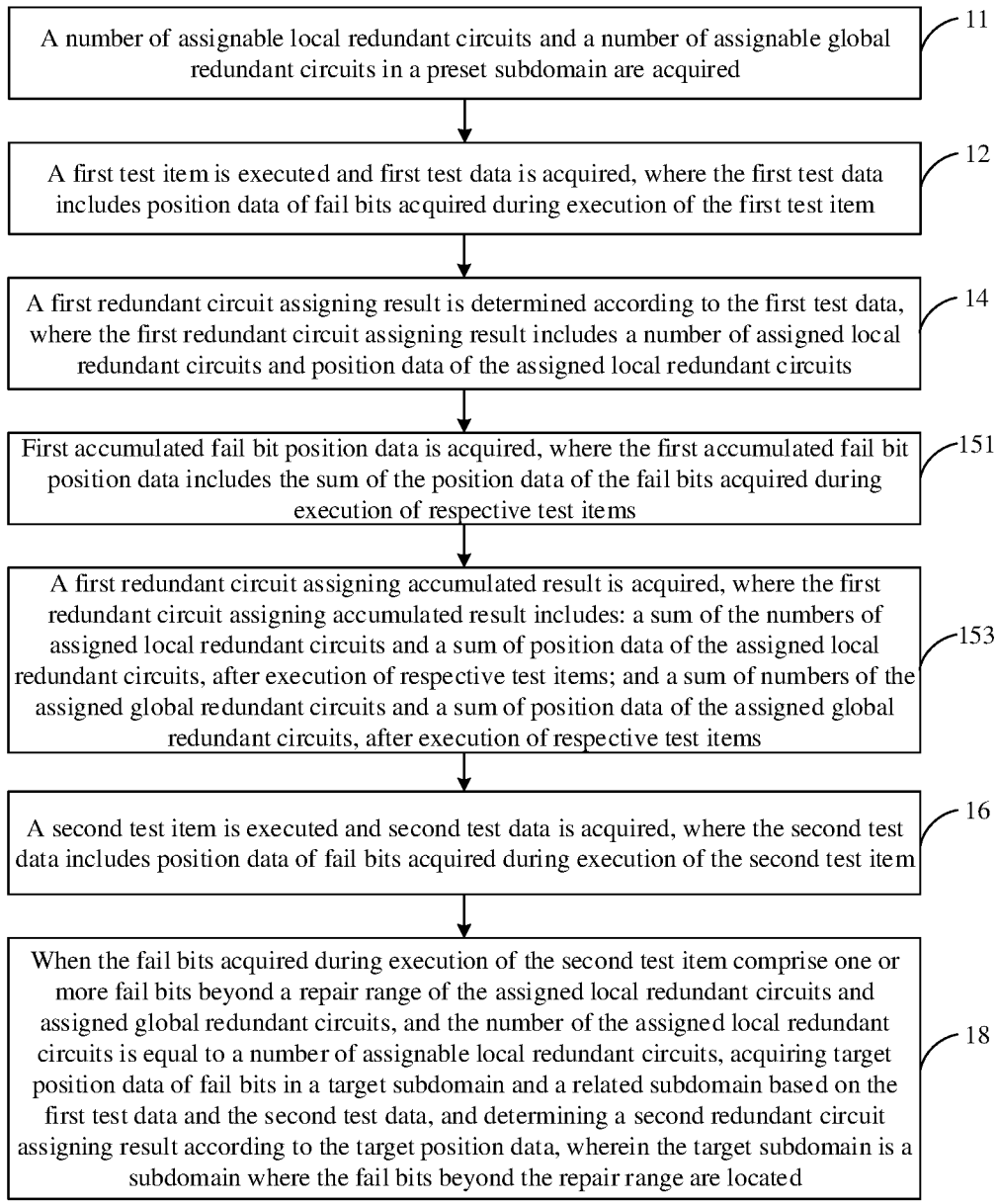
FIG. 3 is a schematic flow diagram of a redundant circuit assigning method according to a third embodiment of the disclosure.

Furthermore, referring to FIG. 3, in an embodiment of the disclosure, the operation after the step that a first redundant circuit assigning result is determined according to the first test data and prior to the step that the second test item is executed and the second test data is acquired, further includes the following operations.

In S151, first accumulated fail bit position data is acquired, where the first accumulated fail bit position data includes the sum of the position data of the fail bits acquired during execution of respective test items.

In S153, a first redundant circuit assigning accumulated result is acquired, where the first redundant circuit assigning accumulated result includes: a sum of the numbers of assigned local redundant circuits and a sum of position data of the assigned local redundant circuits, after execution of respective test items; and a sum of numbers of the assigned global redundant circuits and a sum of position data of the assigned global redundant circuits, after execution of respective test items.

As an example, with further reference to FIG. 3, by acquiring the first accumulated fail bit position data that includes the sum of position data of fail bits acquired during execution of respective test items, repeated test for the fail bits with known position data is no longer performed during execution of the second test item, so that the execution efficiency of the test item is improved, and the position data of all fail bits is detected as much as possible. By acquiring the first redundant circuit assigning accumulated result, after each executed test item, it is determined whether the repair range of the assigned global redundant circuits and the assigned local redundant circuits can cover all fail bits with known position data, and it is determined whether the redundant circuit assigning scheme can be further optimized, where the first redundant circuit assigning accumulated result includes: a sum of the numbers of assigned local redundant circuits and a sum of position data of the assigned local redundant circuits, after execution of respective test items; and a sum of numbers of the assigned global redundant circuits and a sum of position data of the assigned global redundant circuits, after execution of respective test items. Therefore. On the premise of avoiding missing repair or repeated repair of the fail bits, the number of the assigned local redundant circuits and the number of the assigned global redundant circuits are reduced as much as possible.

As an example, in an embodiment of the disclosure, the operation after the step that a first redundant circuit assigning result is determined according to the first test data and prior to the step that the second test item is executed and the second test data is acquired, further includes the following operations.

In S1521, a name of the first test item is acquired.

In S1522, the first accumulated fail bit position result is generated, and the first accumulated fail bit position result includes the name of the first test item and the first accumulated fail bit position data.

Specifically, the (m−1)-th accumulated fail bit position result can be generated according to the acquired name of the (m−1)-th test item, the (m−1)-th accumulated fail bit position result includes the name of the (m−1)-th test item and the (m−1)-th accumulated fail bit position data so as to obtain the m-th accumulated fail bit position data, and the m-th accumulated fail bit position data is the sum of the (m−1)th accumulated fail bit position data and the fail bit position data obtained during execution of the m-th test item; and then the m-th redundant circuit assigning accumulated result is obtained, the m-th redundant circuit assigning accumulated result is the sum of the (m−1)-th redundant circuit assigning accumulated result and the m-th redundant circuit assigning result, where m is the number of the test items to be executed, and m is an integer larger than or equal to 2. Therefore, whether the repair range of the assigned redundant circuits completely covers all fail bits with the known position data is determined according to the m-th redundant circuit assigning accumulated result. The assigned redundant circuits can include global redundant circuits and local redundant circuits, an extension direction of the local redundant circuits is consistent with an extension direction of bit lines, and an extension direction of the global redundant circuits is consistent with an extension direction of word lines.

Figure 4:
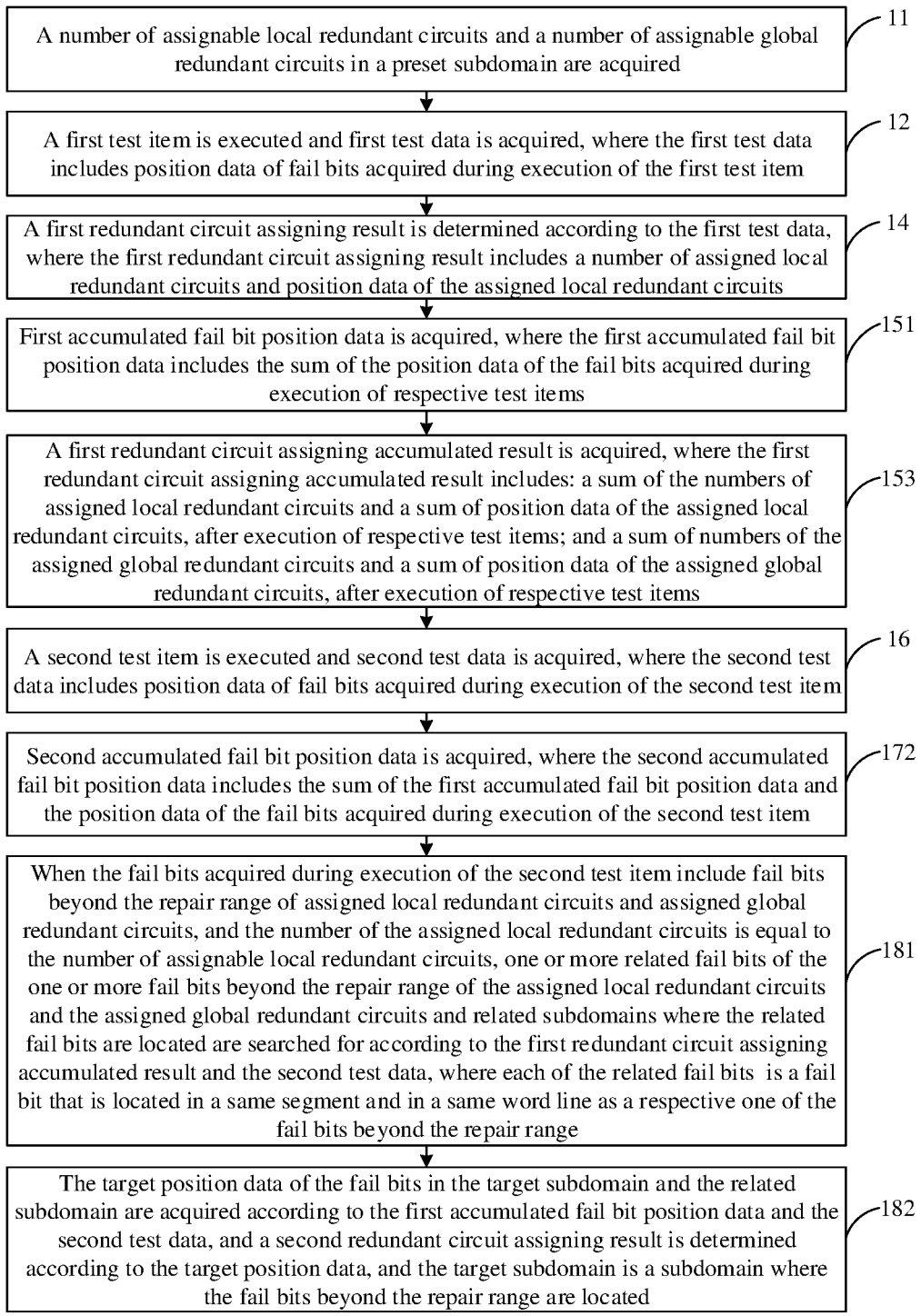
FIG. 4 is a schematic flow diagram of a redundant circuit assigning method according to a fourth embodiment of the disclosure.

Furthermore, referring to FIG. 4, in an embodiment of the disclosure, a redundant circuit assigning method is provided, which includes the following operations.

In S11, a number of assignable local redundant circuits and a number of assignable global redundant circuits in a preset subdomain are acquired.

In S12, a first test item is executed and first test data is acquired, where the first test data includes position data of fail bits acquired during execution of the first test item.

In S14, a first redundant circuit assigning result is determined according to the first test data, and the first redundant circuit assigning result includes the number of assigned local redundant circuits and position data of the assigned local redundant circuits.

In S151, first accumulated fail bit position data is acquired, where the first accumulated fail bit position data includes the sum of the position data of the fail bits acquired during execution of respective test items.

In S153, a first redundant circuit assigning accumulated result is acquired, where the first redundant circuit assigning accumulated result includes: a sum of the numbers of assigned local redundant circuits and a sum of position data of the assigned local redundant circuits, after execution of respective test items; and a sum of numbers of the assigned global redundant circuits and a sum of position data of the assigned global redundant circuits, after execution of respective test items.

In S16, a second test item is executed and second test data is acquired, where the second test data includes position data of fail bits acquired during execution of the second test item.

In S172, second accumulated fail bit position data is acquired, where the second accumulated fail bit position data includes the sum of the first accumulated fail bit position data and the position data of the fail bits acquired during execution of the second test item.

In S181, when the fail bits acquired during execution of the second test item include one or more fail bits beyond the repair range of assigned local redundant circuits and assigned global redundant circuits, and the number of the assigned local redundant circuits is equal to the number of assignable local redundant circuits, one or more related fail bits of the one or more fail bits beyond the repair range of the assigned local redundant circuits and the assigned global redundant circuits and related subdomains where the related fail bits are located are searched for according to the first redundant circuit assigning accumulated result and the second test data, where each of the related fail bits is a fail bit that is located in a same segment and in a same word line as a respective one of the fail bits beyond the repair range.

In S182, the target position data of the fail bits in the target subdomain and the related subdomain are acquired according to the first accumulated fail bit position data and the second test data, and a second redundant circuit assigning result is determined according to the target position data, and the target subdomain is a subdomain where the fail bits beyond the repair range are located.

Specifically, after the second test item is executed and second test data are acquired, where the second test data includes position data of fail bits acquired during execution of the second test item, and after the first redundant circuit assigning accumulated result and the second test data are acquired, whether fail bits beyond the repair range of the assigned local redundant circuits and the assigned global redundant circuit exist can be determined through comparison. When the fail bits acquired during execution of the second test item include one or more fail bits beyond the repair range of assigned local redundant circuits and assigned global redundant circuits, and the number of the assigned local redundant circuits is equal to the number of assignable local redundant circuits, whether fail bits beyond the repair range exist in each segment in the global region can be checked in sequence, the subdomain with the fail bits beyond the repair range is taken as a target subdomain, then a related subdomain related with the target subdomain is searched out. In this way, redundant circuit assigning calculation is performed according to the target position data of the fail bits of the target subdomain and the related subdomain to obtain the second redundant circuit assigning result. Due to the fact that the related subdomain includes the fail bits which are located in the same segment and in the same word line, the sum of the number of the assigned local redundant circuits and the number of assigned global redundant circuits can be reduced as much as possible based on redundant circuit assigning calculation, for example, two fail bits needing to be repaired by two local redundant circuits are instead repaired by a global redundant circuit. On the premise of ensuring that all the fail bits can be repaired by the assigned local redundant circuits and the assigned global redundant circuits, the situation of repeated repair is avoided, and the utilization efficiency of the redundant circuits is improved.

As an example, in an embodiment of the disclosure, the operation after the step that the second test item is executed and the second test data is acquired, further includes the following operations.

In S1711, the name of the second test item is acquired.

In S1712, the second accumulated fail bit position result is generated, and the second accumulated fail bit position result includes the name of the second test item and the second accumulated fail bit position data.

Specifically, the m-th accumulated fail bit position result can be generated according to the acquired name of the m-th test item, the m-th accumulated fail bit position result includes the name of the m-th test item and the m-th accumulated fail bit position data so as to generate an m-th accumulated fail bit position file according to the m-th accumulated fail bit position result, and the m-th accumulated fail bit position result file includes the (m−1)-th accumulated fail bit position result and the m-th accumulated fail bit position result. Where m is the number of test items to be executed and is an integer greater than or equal to 2. Therefore, whether the repair range of the assigned redundant circuits completely covers all fail bits with the known position data is determined according to the m-th redundant circuit assigning accumulated result. The assigned redundant circuits can include global redundant circuits and local redundant circuits, an extension direction of the local redundant circuits is consistent with an extension direction of bit lines, and an extension direction of the global redundant circuits is consistent with an extension direction of word lines.

Figure 5:
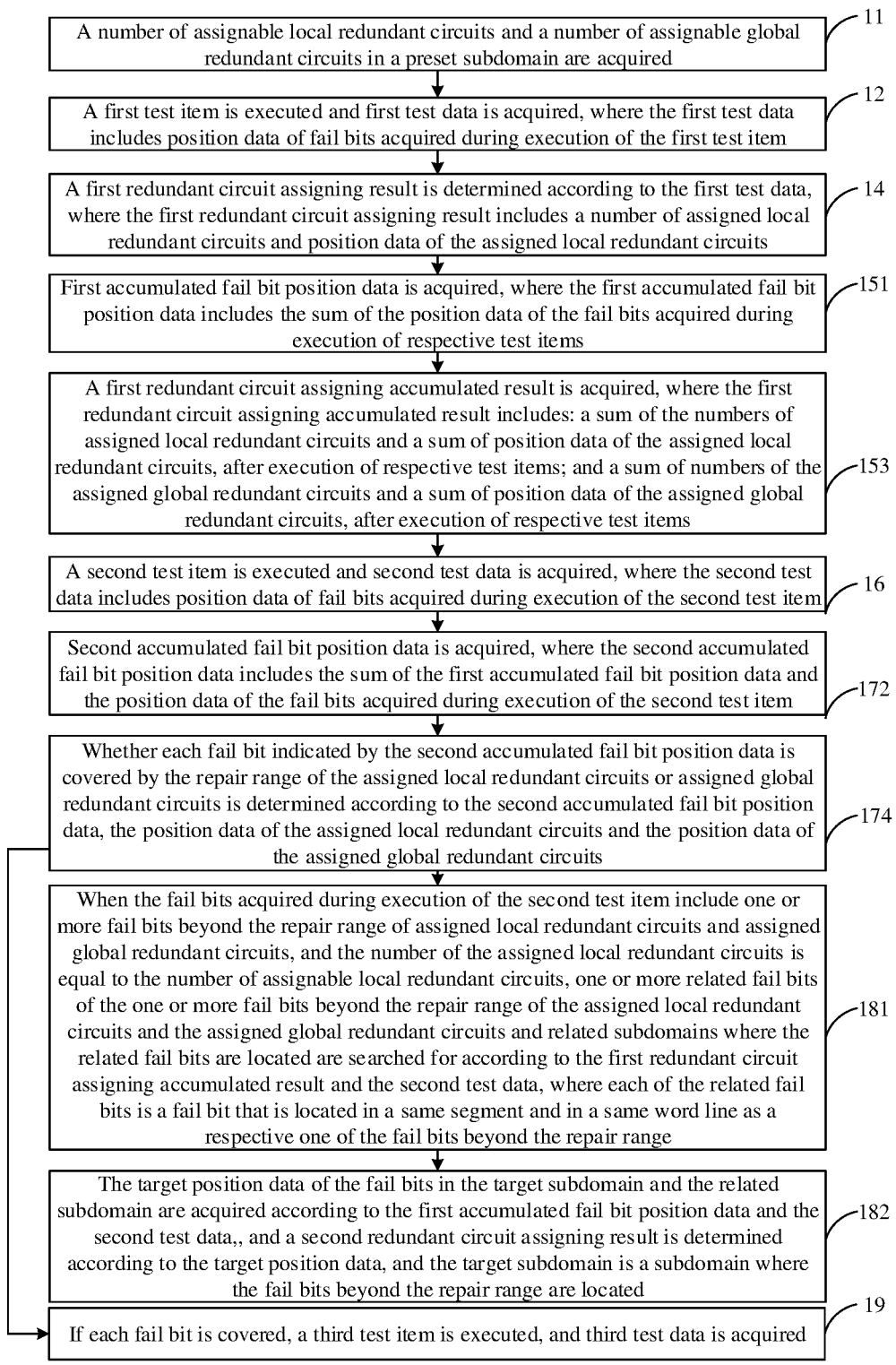
FIG. 5 is a schematic flow diagram of a redundant circuit assigning method according to a fifth embodiment of the disclosure.

Furthermore, referring to FIG. 5, in an embodiment of the disclosure, the operation after the step that the second test item is executed and the second test data is acquired, further includes the following operations.

In S174, whether each fail bit indicated by the second accumulated fail bit position data is covered by the repair range of the assigned local redundant circuits or assigned global redundant circuits is determined according to the second accumulated fail bit position data, the position data of the assigned local redundant circuits and the position data of the assigned global redundant circuits.

In S19, if each fail bit is covered, a third test item is executed, and third test data is acquired.

Because the acquired position data of all the fail bits is covered by the repair range of the assigned local redundant circuits or the assigned global redundant circuits, the repair action can be executed according to the redundant circuit assigning result, so that each fail bit indicated by the second accumulated fail bit position data is covered by the repair range of the assigned local redundant circuits or the assigned global redundant circuits, and the yield of the semiconductor memory chip is effectively improved. The redundant circuit assigning result is determined according to all fail bits with known position data, on the premise of ensuring that all the fail bits can be repaired by the assigned local redundant circuits and the assigned global redundant circuits, the sum of the number of the assigned local redundant circuits and the number of the assigned global redundant circuits is reduced as much as possible, the situation of repeated repair is avoided, and the utilization efficiency of the redundant circuits is improved.

Figure 6:
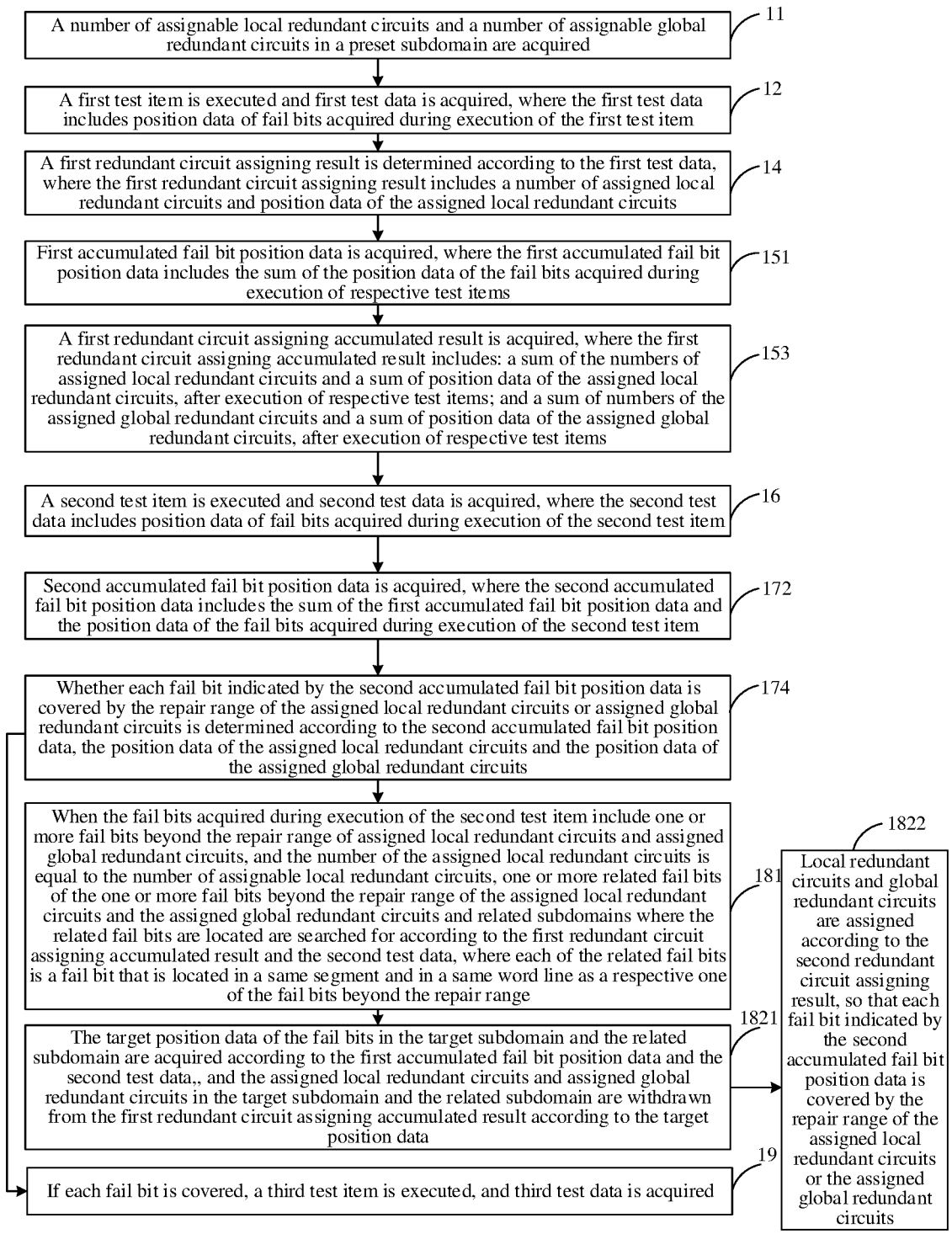
FIG. 6 is a schematic flow diagram of a redundant circuit assigning method according to a sixth embodiment of the disclosure.

Furthermore, referring to FIG. 6, in an embodiment of the disclosure, the difference with the embodiment shown in FIG. 5 is that S182 further includes the following operations.

In S1821, the target position data of the fail bits in the target subdomain and the related subdomain are acquired according to the first accumulated fail bit position data and the second test data, and the assigned local redundant circuits and assigned global redundant circuits in the target subdomain and the related subdomain are withdrawn from the first redundant circuit assigning accumulated result according to the target position data.

In S1822, local redundant circuits and global redundant circuits are assigned according to the second redundant circuit assigning result, so that each fail bit indicated by the second accumulated fail bit position data is covered by the repair range of the assigned local redundant circuits or the assigned global redundant circuits.

If it is detected that the fail bits with the known position data are located beyond the repair range coverage of the assigned local redundant circuits or the assigned global redundant circuits, the assigned local redundant circuits and the assigned global redundant circuits in the target subdomain and the related subdomain are withdrawn, the second redundant circuit assigning result is determined according to the target position data of the fail bits in the target subdomain and the related subdomain, therefore, the local redundant circuits and the global redundant circuits are assigned according to the second redundant circuit assigning result, so that each fail bit indicated by the second accumulated fail bit position data is covered by the repair range of the assigned local redundant circuits or assigned global redundant circuits. On the premise of avoiding missing repair or repeated repair of the fail bits, the number of assigned local redundant circuits and the number of the assigned global redundant circuits are reduced as much as possible. When the yield is low, the number of the fail bits is large, so that the distribution of the fail bits in one area is relatively complex, the method only performs withdrawing and assignment on the redundant circuits in the subdomain meeting the condition, so that the processing range of calculation of redundant circuit assignment can be greatly reduced, and the calculation speed is increased.

Figure 7A:
FIGS. 7A-7C are schematic diagrams illustrating division of a memory cell array bank of a memory according to an embodiment of the disclosure.
Figure 7B:
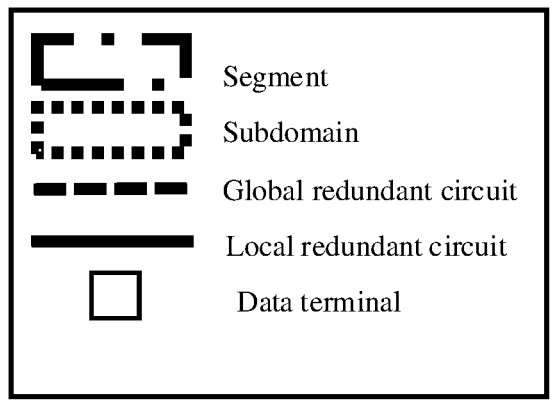

As an example, referring to FIGS. 7A and 7B, in an embodiment of the disclosure, the operation prior to the step that a number of assignable local redundant circuits and a number of assignable global redundant circuits in a preset subdomain are acquired, further includes the following operations: a memory cell array bank of the memory is divided into a plurality of global regions; any one of the global regions is divided into a plurality of segments; any one of the segments is divided into a plurality of subdomains; the assignable global redundant circuits in any segment are not crossed with the assignable global redundant circuits in other segments in the same global region; and the assignable local redundant circuits in any subdomain are not crossed with the assignable local redundant circuits in other subdomains in the same segment.

The memory cell array bank of the memory is divided into a plurality of global regions as shown in FIG. 7A, and then any global region shown in FIG. 7B is divided into a plurality of segments by referring to the segment range, the subdomain range, the global redundant circuit coverage range and the local redundant circuit coverage range as shown in FIG. 7; any one of the segments is divided into a plurality of subdomains; the assignable global redundant circuits in any segment are not crossed with the assignable global redundant circuits in other segments in the same global region; and the assignable local redundant circuits in any subdomain are not crossed with the assignable local redundant circuits in other subdomains in the same segment, the extension direction of each local redundant circuit is consistent with the extension direction BL of bit lines, and the extension direction of each global redundant circuit is consistent with the extension direction WL of word lines. Therefore, the redundant circuit assigning method according to the embodiment of the disclosure is realized. On the premise of ensuring that all the fail bits can be repaired, the utilization efficiency of redundant circuits is improved, the situation of repeated repair is avoided, the repair cost is reduced, and meanwhile, the yield of the semiconductor memory chip is improved.

Figure 7C:
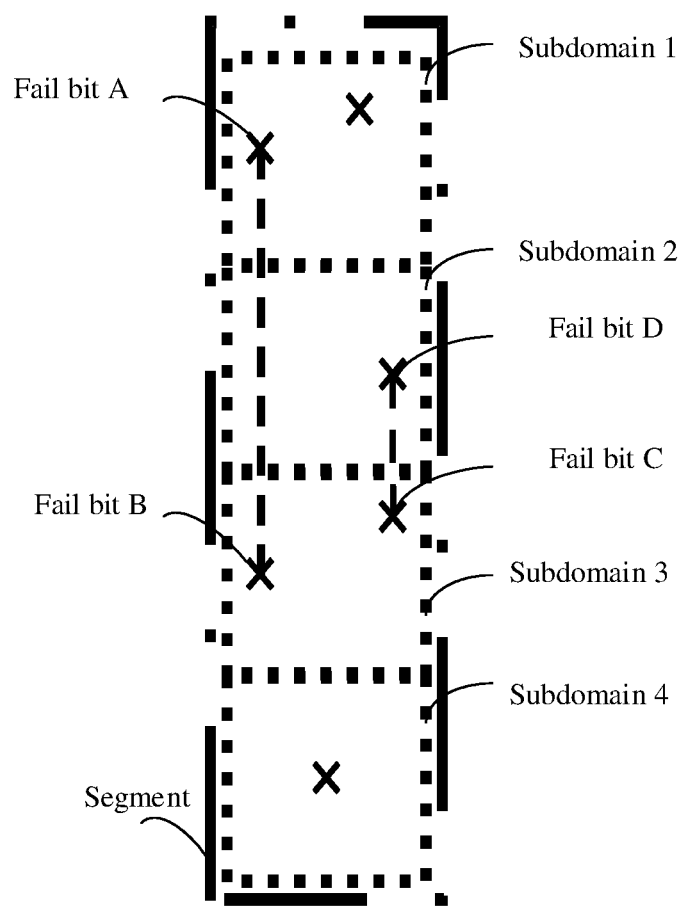

As an example, referring to FIG. 7C, in an embodiment of the disclosure, a segment includes four subdomains, namely, a subdomain 1, a subdomain 2, a subdomain 3, and a subdomain 4, the subdomain 1 and the subdomain 3 are related subdomains because the subdomain 1 and subdomain 3 include fail bits A and fail bits B in the same word line, and the subdomain 2 and the subdomain 3 are related subdomains because the subdomain 2 and the subdomain 3 include the fail bits D and the fail bits C which are located in the same word line. When the fail bits out of the repair range are fail bits A which are located in the subdomain 1 and are located in the same word line as the fail bits B in the subdomain 3, the subdomain 1 is a target subdomain and the subdomain 3 is a related subdomain, the assigned local redundant circuits and assigned global redundant circuits in the subdomain 1 and the subdomain 3 are withdrawn, and position data of all fail bits contained in the subdomain 1 and the subdomain 3 are acquired as target position data, and the second redundant circuit assigning result is determined according to the target position data.

As an example, in one embodiment of the disclosure, it is understood that in the same segment, if subdomain 1 and subdomain 3 are related subdomains and subdomain 2 and subdomain 3 are related subdomains, then subdomain 1 and subdomain 2 are related subdomains. When the fail bits out of the repair range are fail bits A which are located in a subdomain 1 and are located in the same word line as the fail bits B in a subdomain 3, the subdomain 1 is a target subdomain and the subdomain 2 and subdomain 3 are related subdomains, the assigned local redundant circuits and assigned global redundant circuits in the subdomain 1, subdomain 2 and the subdomain 3 are withdrawn, position data of all fail bits contained in the subdomain 1, subdomain 2 and the subdomain 3 are acquired as target position data, and the second redundant circuit assigning result is determined according to the target position data.

As an example, in an embodiment of the disclosure, the first test item includes a test item for electrical performance parameters; the second test item includes a test item for electrical performance parameters, where the electrical performance parameters include at least one of surface resistance, surface resistivity, volume resistance, volume resistivity or breakdown voltage.

It should be understood that while various steps in the flowcharts of FIGS. 1-6 are shown in sequence as indicated by arrows, the steps are not necessarily performed in sequence as indicated by arrows. Except where expressly stated herein, the execution of the steps is not strictly limited in sequence and the steps can be executed in other sequences. Moreover, although at least a portion of the steps in FIGS. 1-6 can include multiple sub-steps or multiple stages, the sub-steps or stages need not necessarily be performed at the same time but can be performed at different times, and the sub-steps or stages cannot necessarily be performed sequentially, rather, can be performed in turn or in alternation with at least a portion of other steps or sub-steps or stages of other steps.

Figure 8:
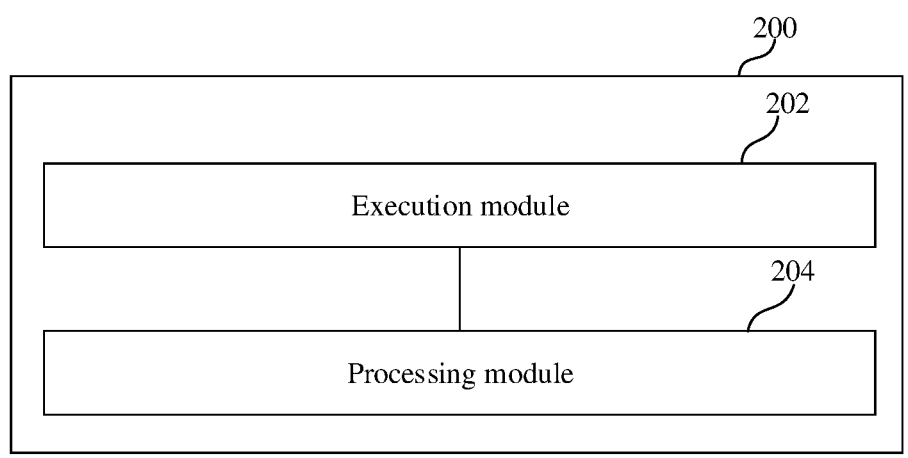
FIG. 8 is a structure diagram of a redundant circuit assigning device according to an embodiment of the disclosure.

Furthermore, referring to FIG. 8, in an embodiment of the disclosure, a redundant circuit assigning device 200 is provided, which includes an execution module 202 and a processing module 204. The execution module 202 is configured to execute a first test item and acquire first test data, where the first test data includes position data of fail bits acquired during execution of the first test item; and the execution module is also configured to execute a second test item and acquire second test data, where the second test data includes position data of fail bits acquired during execution of the second test item. The processing module 204 is configured to determine a first redundant circuit assigning result according to the first test data, and the first redundant circuit assigning result includes the number of assigned local redundant circuits and position data of the assigned local redundant circuits. When the fail bits acquired during execution of the second test item include one or more fail bits beyond the repair range of the assigned local redundant circuits and the assigned global redundant circuits, and the number of the assigned local redundant circuits is equal to the number of assignable local redundant circuits, the processing module acquires target position data of fail bits in a target subdomain and a related subdomain based on the first test data and the second test data, and determines a second redundant circuit assigning result according to the target position data, and the target subdomain is a subdomain where the fail bits beyond the repair range are located. As an example, with further reference to FIG. 8, under the condition that the number of the assignable local redundant circuits and the number of the assignable global redundant circuits are both known, the execution module 202 executes the first test item and acquires the first test data, the first test data includes position data of fail bits acquired during execution of the first test item, then the first redundant circuit assigning result is determined according to the first test data, and the first redundant circuit assigning result includes the number of the assigned local redundant circuits and position data of the assigned local redundant circuits; the execution module 202 executes the second test item and acquires the second test data, where the second test data includes position data of fail bits acquired during execution of the second test item; and when the fail bits acquired during execution of the second test item include one or more fail bits beyond the repair range of assigned local redundant circuits and assigned global redundant circuits, and the number of the assigned local redundant circuits is equal to the number of assignable local redundant circuits, the processing module 204 determines the second redundant circuit assigning result according to the condition of the subdomain where the fail bits to be repaired are located, on the premise of ensuring that all the fail bits can be repaired by the assigned local redundant circuits and the assigned global redundant circuits, the sum of the number of the assigned local redundant circuits and the number of the assigned global redundant circuits is reduced as much as possible, the situation of repeated repair is avoided, and thus the utilization efficiency of the redundant circuits is improved.

Figure 9A:
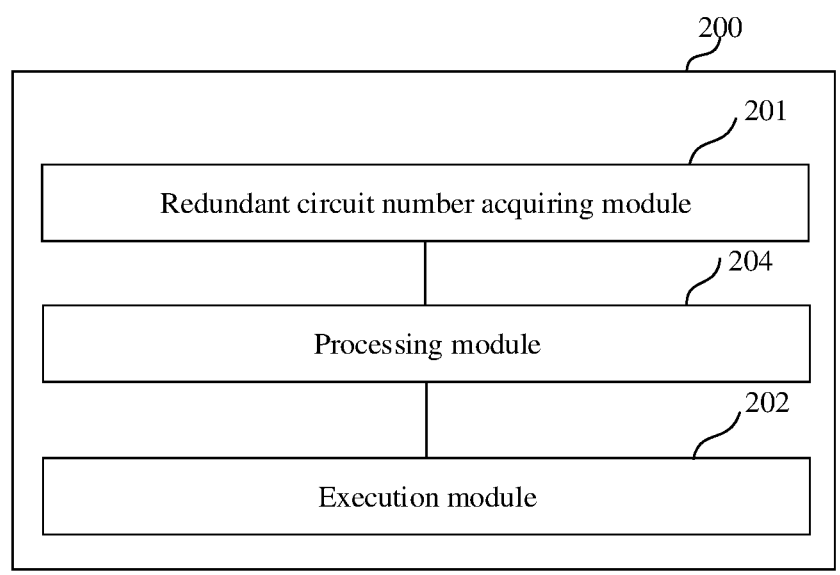
FIGS. 9A and 9B are a schematic diagram and a workflow schematic diagram of a redundant circuit assigning device according to another embodiment of the disclosure.

Furthermore, referring to FIG. 9A, in an embodiment of the disclosure, the redundant circuit assigning device 200 further includes a redundant circuit number acquiring module 201 configured to acquire a number of assignable local redundant circuits and a number of assignable global redundant circuits in a preset subdomain. Therefore, a preferable redundant circuit assigning scheme is determined according to the number of the assignable local redundant circuits and the number of assignable global redundant circuits. On the premise of ensuring that all fail bits can be repaired by the assigned local redundant circuits and the assigned global redundant circuits, the sum of the number of the assigned local redundant circuits and the number of the assigned global redundant circuits is reduced as much as possible, the situation of repeated repair is avoided, and thus the utilization efficiency of the redundant circuits is improved.

Figure 9B:
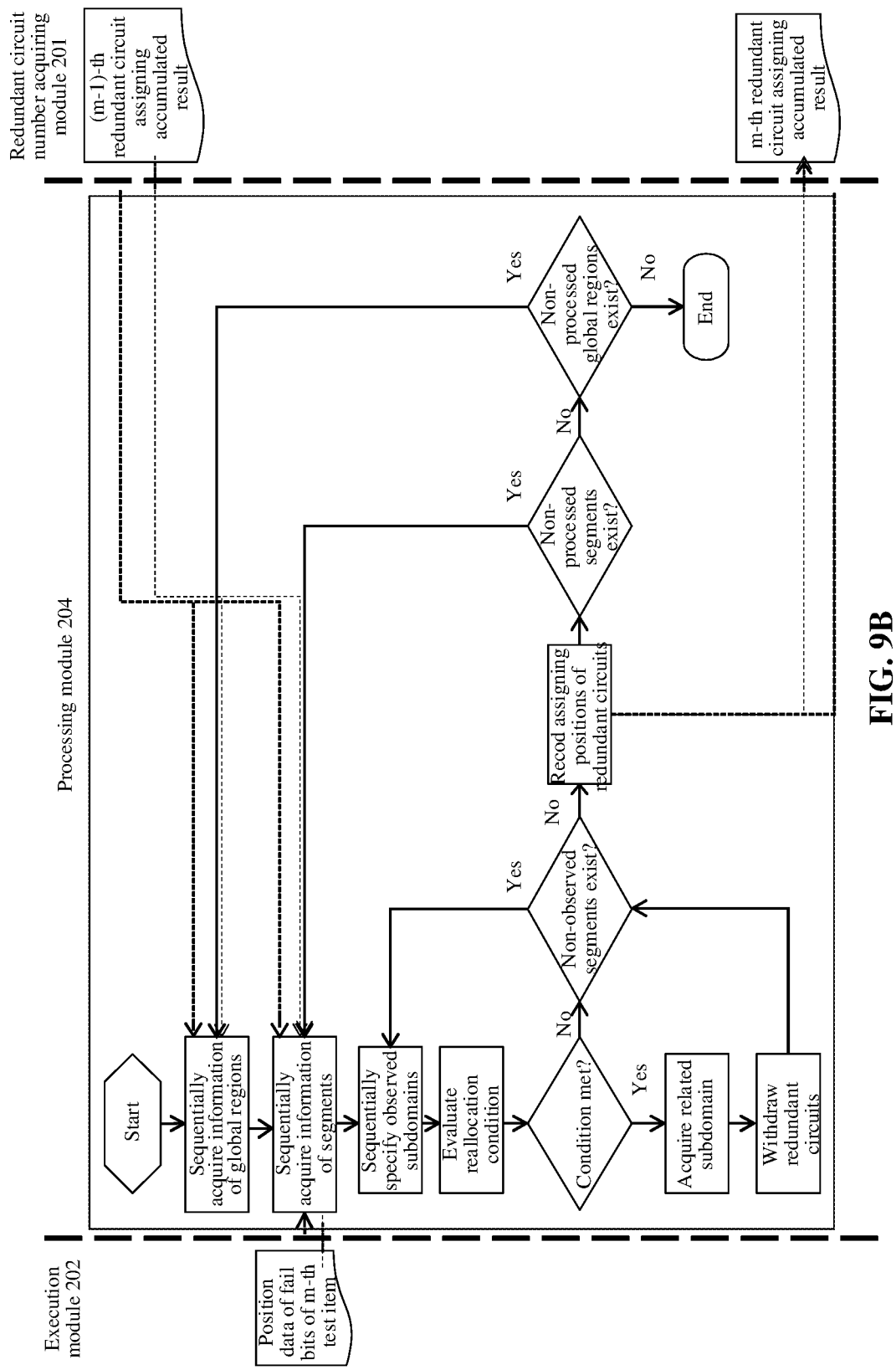

As an example, in an embodiment of the disclosure, a workflow diagram of the redundant circuit number acquiring module 201, the execution module 202 and the processing module 204 is shown in FIG. 9B. A processed global region is specified in all the global regions of the memory chip, and the assigned local redundant circuits and the assigned global redundant circuits in the global region are acquired based on the (m−1)-th redundant circuit assigning accumulated result. In the specified processed global region, processed segments are specified from all segments in sequence, position data of all fail bits in each specified processed segment is acquired from the position data of the fail bits of the m-th test item, and the assigned local redundant circuits and the assigned global redundant circuits in each segment can be obtained through the (m−1)-th redundant circuit assigning accumulated result. In a specified processed segment, observed subdomains are specified sequentially from all the subdomains. Whether the observed subdomains meet the condition is evaluated, where the condition includes whether the fail bits acquired during execution of the second test item include one or more fail bits beyond the repair range of assigned local redundant circuits and assigned global redundant circuits, and whether the number of the assigned local redundant circuits is equal to the number of assignable local redundant circuits; if the condition is met, the subdomain is a target subdomain. A related subdomain of the target subdomain is acquired, the assigned local redundant circuits and assigned global redundant circuits in the target subdomain and the related subdomain are withdrawn from the (m−1)-th redundant circuit assigning accumulated result, and the m-th redundant circuit assigning result is determined according to the target position data of the fail bits of the target subdomain and the related subdomain, and the m-th redundant circuit assigning result is combined with the (m−1)-th redundant circuit assigning accumulated result which has executed the withdrawing operation to obtain the m-th redundant circuit assigning accumulated result.

As an example, in an embodiment of the disclosure, an extension direction of the local redundant circuits is consistent with an extension direction of bit lines, an extension direction of the global redundant circuits is consistent with an extension direction of word lines, so that the local redundant circuits can repair the fail bits in the row direction in the memory cell array, and the global redundant circuits can repair the fail bits in the column direction in the memory cell array.

The various modules in the redundant circuit assigning device described above can be implemented in whole or in part by software, hardware, and combinations thereof. The modules can be embedded in or independent of a processor in computer apparatus in a hardware form, and can also be stored in a memory in the computer device in a software form, so that the processor can call and execute operations corresponding to the modules.

Figure 10:
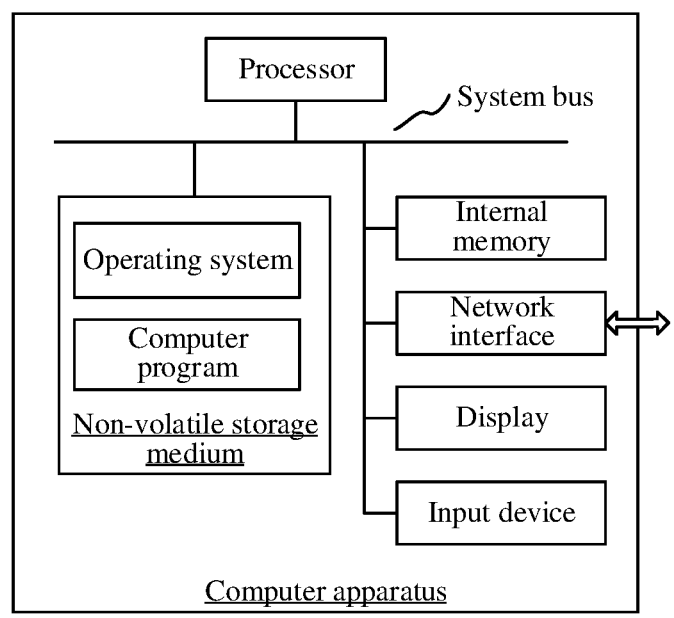
FIG. 10 is a structural schematic diagram of a computer apparatus according to an embodiment of the disclosure.

Furthermore, in an embodiment of the disclosure, a computer apparatus, which can be a terminal, is provided, and the internal structural diagram of which can be shown in FIG. 10. The computer apparatus includes a processor, a memory, a network interface, a display screen and an input device which are connected through a system bus. The processor of the computer apparatus is configured to provide computation and control capabilities. The memory of the computer apparatus includes a non-volatile storage medium, and an internal memory. The non-volatile storage medium stores an operating system and a computer program. The computer program, when executed by the processor, implements the redundant circuit assigning method. The display screen of the computer apparatus can be a liquid crystal display screen or an electronic ink display screen, and the input device of the computer apparatus can be a touch layer covering the display screen, can also be a key, a trackball or a touchpad arranged on a shell of the computer apparatus, and can also be an external keyboard, a trackpad or a mouse and the like.

Those skilled in the art will appreciate that the structure shown in FIG. 10 is merely a block diagram of a portion of the structure related with the solution of the disclosure and does not constitute a limitation of the computer apparatus to which the solution of the disclosure is applied, and that the particular computer apparatus can include more or fewer components than shown, or combine certain components, or have a different arrangement of components.

In an embodiment of the disclosure, there is provided a computer-readable storage medium having stored thereon a computer program which, when executed by a processor, implements the steps of the redundant circuit assigning method as described in any one of the embodiments of the disclosure.

Those of ordinary skill in the art will appreciate that implementing all or part of the processes in the methods described above can be accomplished by instructing related hardware by a computer program, which can be stored in a non-volatile computer-readable storage medium, which, when executed, processes can be included as embodiments of the methods described above. Any reference to memory, storage, database, or other medium used in the various embodiments provided herein can include non-volatile and/or volatile memory. Nonvolatile memory can include Read Only Memory (ROM), Programmable ROM (PROM), Electrically Programmable ROM (EPROM), Electrically Erasable Programmable ROM (EEPROM), or flash memory. Volatile memory can include Random Access Memory (RAM) or external cache memory. By way of illustration and not limitation, RAM is available in many forms such as Static RAM (SRAM), Dynamic RAM (DRAM), Synchronous DRAM (SDRAM), Double Data Rate SDRAM (DDRSDRAM), Enhanced SDRAM (ESDRAM), Direct Rambus Dynamic RAM (DRDRAM), and Rambus Dynamic RAM (RDRAM), among others.

The technical features of the above-described embodiments can be randomly combined, and not all possible combinations of the technical features in the above-described embodiments are described for simplicity of description, however, as long as the combinations of the technical features do not contradict each other, they should be considered to be within the scope of the description of the present specification.

The embodiments described above represent only several implementation modes of the disclosure, and the description thereof is specific and detailed, but should not be construed as limiting the scope of disclosure accordingly. It should be pointed out that those of ordinary skill in the art can also make some modifications and improvements without departing from the concept of the disclosure, and these modifications and improvements all fall within the scope of protection of the disclosure. Accordingly, the scope of the patent of the present application should be subject to the appended claims.

The invention claimed is:

1. A redundant circuit assigning method, comprising
executing a first test item and acquiring first test data, wherein the first test data comprises position data of fail bits acquired during execution of the first test item;
determining a first redundant circuit assigning result according to the first test data, wherein the first redundant circuit assigning result comprises a number of assigned local redundant circuits and position data of the assigned local redundant circuits;
executing a second test item and acquiring second test data, wherein the second test data comprises position data of fail bits acquired during execution of the second test item; and
when the fail bits acquired during execution of the second test item comprise one or more fail bits beyond a repair range of the assigned local redundant circuits and assigned global redundant circuits, and the number of the assigned local redundant circuits is equal to a number of assignable local redundant circuits, acquiring target position data of fail bits in a target subdomain and a related subdomain based on the first test data and the second test data, and determining a second redundant circuit assigning result according to the target position data, wherein the target subdomain is a subdomain where the fail bits beyond the repair range are located.

2. The method of claim 1, further comprising: before executing the first test item and acquiring the first test data,
acquiring a number of assignable local redundant circuits and a number of assignable global redundant circuits in a preset subdomain.

3. The method of claim 2, wherein:
an extension direction of the assignable local redundant circuits is consistent with an extension direction of bit lines; and
an extension direction of the assignable global redundant circuits is consistent with an extension direction of word lines.

4. The method of claim 2, further comprising: after determining the first redundant circuit assigning result according to the first test data and before executing the second test item and acquiring the second test data,
acquiring first accumulated fail bit position data, wherein the first accumulated fail bit position data comprises a sum of the position data of the fail bits acquired during execution of respective test items; and
acquiring a first redundant circuit assigning accumulated result, wherein the first redundant circuit assigning accumulated result comprises: a sum of the numbers of assigned local redundant circuits and a sum of position data of the assigned local redundant circuits, after execution of respective test items; and a sum of numbers of the assigned global redundant circuits and a sum of position data of the assigned global redundant circuits, after execution of respective test items.

5. The method of claim 4, further comprising: after determining the first redundant circuit assigning result according to the first test data and before executing the second test item and acquiring the second test data,
acquiring a name of the first test item; and
generating a first accumulated fail bit position result, wherein the first accumulated fail bit position result comprises the name of the first test item and the first accumulated fail bit position data.

6. The method of claim 4, wherein acquiring the target position data of the fail bits in the target subdomain and the related subdomain based on the first test data and the second test data comprises:
searching for one or more related fail bits of the one or more fail bits beyond the repair range of the assigned local redundant circuits and the assigned global redundant circuits and a related subdomain where the related fail bits are located according to the first redundant circuit assigning accumulated result and the second test data, wherein each of the related fail bits is a fail bit that is located in a same segment and in a same word line as a respective one of the fail bits beyond the repair range: and
acquiring the target position data of the fail bits in the target subdomain and the related subdomain according to the first accumulated fail bit position data and the second test data.

7. The method of claim 6, further comprising: after executing the second test item and acquiring the second test data,
acquiring second accumulated fail bit position data, wherein the second accumulated fail bit position data is a sum of first accumulated fail bit position data and the position data of the fail bits acquired during execution of the second test item, and acquiring a name of the second test item; and
generating a second accumulated fail bit position result, wherein the second accumulated fail bit position result comprises the name of the second test item and the second accumulated fail bit position data.

8. The method of claim 7, further comprising: after executing the second test item and acquiring the second test data,
determining whether each fail bit indicated by the second accumulated fail bit position data is covered by the repair range of the assigned local redundant circuits or assigned global redundant circuits according to the second accumulated fail bit position data, the position data of the assigned local redundant circuits and the position data of the assigned global redundant circuits; and
if each fail bit is covered, executing a third test item, and acquiring third test data.

9. The method of claim 7, wherein determining the second redundant circuit assigning result according to the target position data further comprises:
withdrawing assigned local redundant circuits and assigned global redundant circuits in the target subdomain and the related subdomain from the first redundant circuit assigning accumulated result; and
assigning local redundant circuits and global redundant circuits according to the second redundant circuit assigning result, so that each fail bit indicated by the second accumulated fail bit position data is covered by the repair range of the assigned local redundant circuits or assigned global redundant circuits.

10. The method of claim 2, further comprising: before acquiring the number of assignable local redundant circuits and the number of assignable global redundant circuits in the preset subdomain,
dividing a memory cell array bank of memory into a plurality of global regions;
dividing any one of the global regions into a plurality of segments;
dividing any one of the segments into a plurality of subdomains,
wherein the assignable global redundant circuits in any segment are not crossed with the assignable global redundant circuits in other segments in a same global region; and the assignable local redundant circuits in any subdomain are not crossed with the assignable local redundant circuits in other subdomains in a same segment.

11. The method of claim 1, wherein:
the first test item comprises a test item for electrical performance parameters;
the second test item comprises a test item for electrical performance parameters; and
the electrical performance parameters comprise at least one of surface resistance, surface resistivity, volume resistance, volume resistivity or breakdown voltage.

12. A redundant circuit assigning device, comprising:
a memory storing processor-executable instructions; and a processor configured to execute the processor-executable instructions to perform operations of:
executing a first test item and acquiring first test data, wherein the first test data comprises position data of fail bits acquired during execution of the first test item;
determining a first redundant circuit assigning result according to the first test data, wherein the first redundant circuit assigning result comprises a number of assigned local redundant circuits and position data of the assigned local redundant circuits;
executing a second test item and acquiring second test data, wherein the second test data comprises position data of fail bits acquired during execution of the second test item; and
when the fail bits acquired during execution of the second test item comprise one or more fail bits beyond a repair range of the assigned local redundant circuits and assigned global redundant circuits, and the number of the assigned local redundant circuits is equal to a number of assignable local redundant circuits, acquiring target position data of fail bits in a target subdomain and a related subdomain based on the first test data and the second test data, and determining a second redundant circuit assigning result according to the target position data, wherein the target subdomain is a subdomain where the fail bits beyond the repair range are located.

13. The device of claim 12, wherein the processor is configured to execute the processor-executable instructions to perform an operation of: before executing the first test item and acquiring the first test data,
acquiring a number of assignable local redundant circuits and a number of assignable global redundant circuits in a preset subdomain.

14. The device of claim 13, wherein:
an extension direction of the local redundant circuits is consistent with an extension direction of bit lines; and
an extension direction of the global redundant circuits is consistent with an extension direction of word lines.

15. The device of claim 13, wherein the processor is configured to execute the processor-executable instructions to perform operations of: after determining the first redundant circuit assigning result according to the first test data and before executing the second test item and acquiring the second test data,
acquiring first accumulated fail bit position data, wherein the first accumulated fail bit position data comprises a sum of the position data of the fail bits acquired during execution of respective test items; and
acquiring a first redundant circuit assigning accumulated result, wherein the first redundant circuit assigning accumulated result comprises: a sum of the numbers of assigned local redundant circuits and a sum of position data of the assigned local redundant circuits, after execution of respective test items; and a sum of numbers of the assigned global redundant circuits and a sum of position data of the assigned global redundant circuits, after execution of respective test items.

16. The device of claim 15, wherein the processor is configured to execute the processor-executable instructions to perform operations of: after determining the first redundant circuit assigning result according to the first test data and before executing the second test item and acquiring the second test data,
acquiring a name of the first test item; and
generating a first accumulated fail bit position result, wherein the first accumulated fail bit position result comprises the name of the first test item and the first accumulated fail bit position data.

17. The device of claim 15, wherein acquiring the target position data of the fail bits in the target subdomain and the related subdomain based on the first test data and the second test data comprises:
searching for one or more related fail bits of the one or more fail bits beyond the repair range of the assigned local redundant circuits and the assigned global redundant circuits and a related subdomain where the related fail bits are located according to the first redundant circuit assigning accumulated result and the second test data, wherein each of the related fail bits is a fail bit that is located in a same segment and in a same word line as a respective one of the fail bits beyond the repair range: and
acquiring the target position data of the fail bits in the target subdomain and the related subdomain according to the first accumulated fail bit position data and the second test data.

18. The device of claim 17, wherein the processor is configured to execute the processor-executable instructions to perform operations of: after executing the second test item and acquiring the second test data,
acquiring second accumulated fail bit position data, wherein the second accumulated fail bit position data is a sum of first accumulated fail bit position data and the position data of the fail bits acquired during execution of the second test item, and acquiring a name of the second test item; and
generating a second accumulated fail bit position result, wherein the second accumulated fail bit position result comprises the name of the second test item and the second accumulated fail bit position data.

19. The device of claim 18, wherein the processor is configured to execute the processor-executable instructions to perform operations of: after executing the second test item and acquiring the second test data,
determining whether each fail bit indicated by the second accumulated fail bit position data is covered by the repair range of the assigned local redundant circuits or assigned global redundant circuits according to the second accumulated fail bit position data, the position data of the assigned local redundant circuits and the position data of the assigned global redundant circuits; and
if each fail bit is covered, executing a third test item, and acquiring third test data.

20. A non-transitory computer-readable storage medium having stored thereon computer-executable instructions that, when executed by a processor, cause the processor to perform operations of:
executing a first test item and acquiring first test data, wherein the first test data comprises position data of fail bits acquired during execution of the first test item;
determining a first redundant circuit assigning result according to the first test data, wherein the first redundant circuit assigning result comprises a number of assigned local redundant circuits and position data of the assigned local redundant circuits;
executing a second test item and acquiring second test data, wherein the second test data comprises position data of fail bits acquired during execution of the second test item; and
when the fail bits acquired during execution of the second test item comprise one or more fail bits beyond a repair range of the assigned local redundant circuits and assigned global redundant circuits, and the number of the assigned local redundant circuits is equal to a number of assignable local redundant circuits, acquiring target position data of fail bits in a target subdomain and a related subdomain based on the first test data and the second test data, and determining a second redundant circuit assigning result according to the target position data, wherein the target subdomain is a subdomain where the fail bits beyond the repair range are located.

* * * * *